US009329249B2

(12) United States Patent
Begg

(10) Patent No.: US 9,329,249 B2
(45) Date of Patent: May 3, 2016

(54) MRIS SHIM COIL

(75) Inventor: Michael Colin Begg, Worthing (GB)

(73) Assignee: Tesla Engineering Limited, Storrington, Sussex (GB)

( * ) Notice: Subject to any disclaimer, the term of this patent is extended or adjusted under 35 U.S.C. 154(b) by 1147 days.

(21) Appl. No.: 12/654,697

(22) Filed: Dec. 29, 2009

(65) Prior Publication Data
US 2010/0106003 A1    Apr. 29, 2010

Related U.S. Application Data

(62) Division of application No. 10/812,917, filed on Mar. 31, 2004, now Pat. No. 7,657,993.

(30) Foreign Application Priority Data

Apr. 3, 2003 (GB) .................... 0307729.4

(51) Int. Cl.
G01R 33/38 (2006.01)
H01F 41/04 (2006.01)
G01R 33/3875 (2006.01)
H01F 5/00 (2006.01)

(52) U.S. Cl.
CPC ............ *G01R 33/3875* (2013.01); *H01F 5/003* (2013.01); *H01F 41/04* (2013.01); *H01F 41/041* (2013.01); *H01F 41/045* (2013.01); *Y10T 29/4902* (2015.01); *Y10T 29/4906* (2015.01); *Y10T 29/49073* (2015.01); *Y10T 29/49121* (2015.01); *Y10T 29/49833* (2015.01)

(58) Field of Classification Search
CPC ... G01R 33/3875; H01F 41/04; H01F 41/041; H01F 41/045; H01F 5/003; Y10T 29/49121; Y10T 29/4902; Y10T 29/4906; Y10T 29/49073; Y10T 29/49833
USPC ............ 29/602.1, 606, 603.23, 432; 324/318, 324/320; 336/200; 72/335, 338, 339, 379.2
See application file for complete search history.

(56) References Cited

U.S. PATENT DOCUMENTS

| 1,801,214 A | 4/1931 | Von Henke |
| 4,555,291 A | 11/1985 | Tait et al. |
| 4,656,447 A * | 4/1987 | Keim et al. .................. 324/320 |
| 4,840,700 A | 6/1989 | Edelstein et al. |
| 5,197,170 A | 3/1993 | Senda |
| 5,289,129 A * | 2/1994 | Joseph ..................... 324/318 X |
| 5,349,744 A | 9/1994 | Takahashi |

(Continued)

FOREIGN PATENT DOCUMENTS

| EP | 0 560 396 A2 | 9/1993 |
| JP | 58-19148 | 2/1983 |

(Continued)

OTHER PUBLICATIONS

English Translation of Official Action mailed Feb. 26, 2010 in JP 2004-104900.

(Continued)

*Primary Examiner* — A. Dexter Tugbang
(74) *Attorney, Agent, or Firm* — Nixon & Vanderhye PC

(57) ABSTRACT

A shim coil for use in magnetic resonance imaging spectroscopy (MRIS) is formed by cutting or punching in a sheet of electrically conductive material the required coil pattern. The pattern can be punched using a CNC punching or stamping machine.

9 Claims, 4 Drawing Sheets

Schematic sketch of a punched shim saddle (one of a set)

(56) References Cited

U.S. PATENT DOCUMENTS

| | | |
|---|---|---|
| 5,946,198 A | 8/1999 | Hoppe et al. |
| 6,052,627 A | 4/2000 | Nakamura |
| 6,161,276 A | 12/2000 | Droz |
| 6,175,237 B1 | 1/2001 | Doty et al. |
| 6,176,010 B1 | 1/2001 | Droz |
| 6,311,389 B1 | 11/2001 | Uosaki et al. |
| 6,615,481 B1 | 9/2003 | LaPlante et al. |
| 7,657,993 B2 | 2/2010 | Begg |

FOREIGN PATENT DOCUMENTS

| | | |
|---|---|---|
| JP | A-61-225809 | 10/1986 |
| JP | A-62-111404 | 5/1987 |
| JP | A-3-208306 | 9/1991 |
| JP | A-6-5452 | 1/1994 |
| JP | A-6-277193 | 10/1994 |
| JP | A-9-234698 | 9/1997 |
| JP | 2000-223318 | 8/2000 |
| JP | A-2002-26625 | 1/2002 |
| JP | 2003-126059 * | 5/2003 |
| WO | 01/35484 A1 | 5/2001 |
| WO | WO 01/35484 A1 | 5/2001 |

OTHER PUBLICATIONS

English Translation of Official Action mailed Oct. 23, 2009 in JP 2004-104900.

Communication of European Search Report dated Aug. 4, 2004 in EP 0425 1793 and European Search Report completed Jul. 28, 2004 in EP 04 25 1793.

Patent Abstracts of Japan, vol. 0110, No. 70 (E-485), Mar. 3, 1987, as it relates to JP 61-225809 A assigned to Kobe Steel Ltd., filed Oct. 7, 1986.

EPO Examination Report dated Jul. 28, 2010 in EP 04 251 793.8.

* cited by examiner

Schematic sketch of a punched shim saddle (one of a set)

Example of a transverse shim connection scheme (unwrapped)

MRIS SHIM COIL

CROSS-REFERENCE TO RELATED APPLICATIONS

This application is a division of U.S. Ser. No. 10/812,917 filed Mar. 31, 2004 (now. U.S. Pat. No. 7,657,993), which claimed priority based on United Kingdom Application No. 0307729.4 filed Apr. 3, 2003, the entire contents of both of which are hereby incorporated by reference.

BACKGROUND

1. Technical Field

This invention relates to the manufacture of coils for use in magnetic resonance imaging spectroscopy (MRIS).

2. Related Art

Magnetic resonance imaging and spectroscopy (MRIS) systems generally comprise a plurality of cylindrical concentric coils that are located around a region within which a patient can be located. The coils include an outermost DC coil that is used to provide a strong constant magnetic field, an inner radio frequency (RF) coil arrangement that is arranged concentrically within the DC coil and a gradient coil assembly that is located between the RF coil and the outer DC coil. The gradient coil assembly is arranged to generate a time-varying audio frequency magnetic field that causes the response frequency of the nuclei of the patient to depend upon their positions within the field. The coils that generate the strong constant magnetic field are generally superconducting coils. The presence of a patient in the magnetic field may distort the main magnetic field, making it insufficiently uniform for imaging or spectroscopic measurements. A known way of counteracting this effect is by providing multi-turn electrical windings known as shim coils and driving DC electrical currents through those windings. A typical high performance MRIS system may contain eight to twelve shim coils, each of which is arranged to correct an inhomogeneity with a particular spatial form. The shim coils can also be used to correct intrinsic inhomogeneities of the superconductive magnet itself.

It is common practice to incorporate shim coils within the structure of the actively shielded gradient coil assemblies that are switched rapidly on and off in a precisely timed sequence to generate MR images. The gradient sequence contains a range of frequencies from zero to 10 kHz or more and this is often referred to as "audio frequency".

Magnets with different geometries are currently being developed and these include what are known as open magnets with bi-planar gradient and shim assemblies. The present invention is applicable equally to these new geometries.

Shim coils can be divided into two classes. The first class is made up of axial shim coils that comprise a series of complete circular turns and that generate axisymmetric field components. The second class is known as transverse shim coils and these include multiple saddle coils that are typically disposed symmetrically on the surface of a cylinder or some other surface. Depending upon the field component to be corrected, a transverse shim can typically comprise two, four, six, eight or twelve saddles connected in series with successive saddles having alternating signs as shown, for example, in FIG. 2 of the drawings.

A number of methods are known for fabricating shim coils. These include photo-etching and winding using an insulated conductor. The present invention is concerned with an improved method for fabricating shim coils that is applicable not only to saddle-type arrangements, but also to axial shim coils.

BRIEF SUMMARY

According to the present invention, there is provided a method of forming an electrical coil that comprises forming the required coil pattern in a sheet of electrically conductive material by cutting or punching. The pattern may be punched from the sheet using a CNC punching or stamping machine. Alternatively, the pattern may be cut using a laser or a water jet. The resulting coil may be a shim coil for use in an MRIS apparatus.

BRIEF DESCRIPTION OF THE DRAWINGS

The invention will be described now by way of example only with particular reference to the accompanying drawings, wherein.

DETAILED DESCRIPTION OF EXEMPLARY EMBODIMENTS

Figure 1:
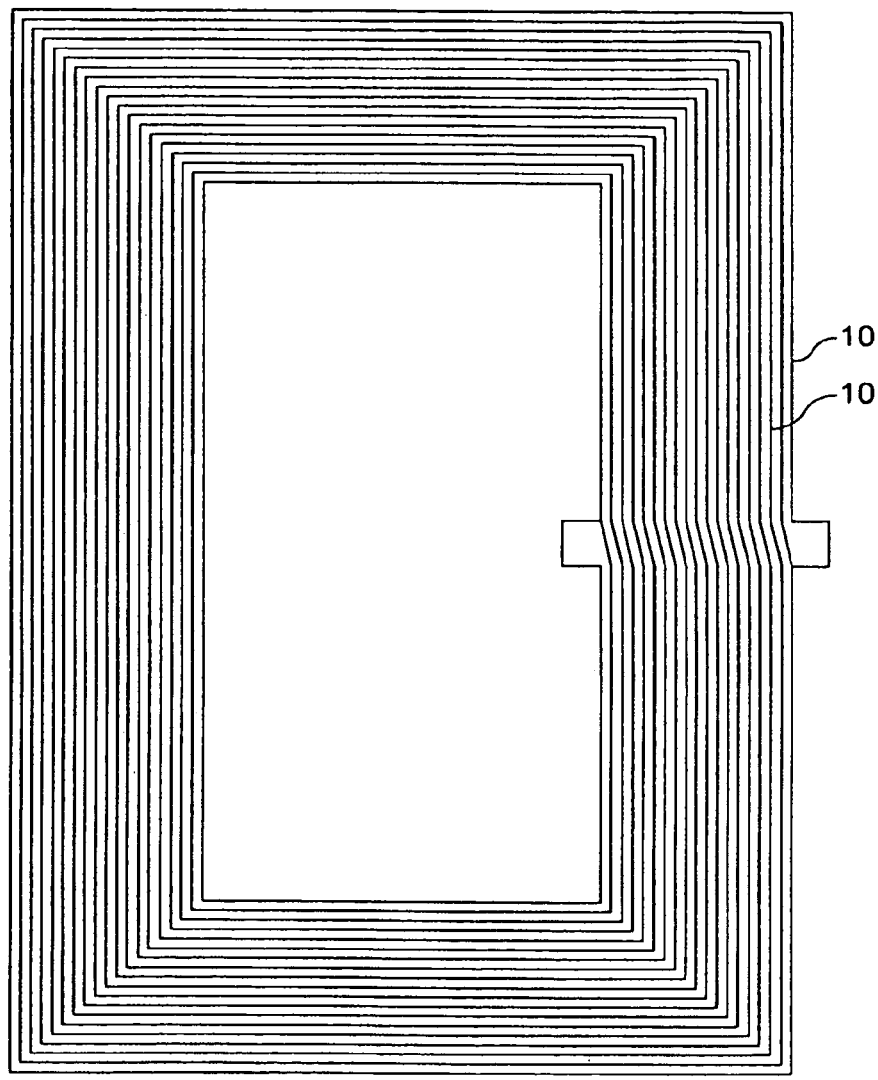
FIG. 1 is a schematic view of a shim saddle coil formed by the method in accordance with the present invention.
Figure 2:
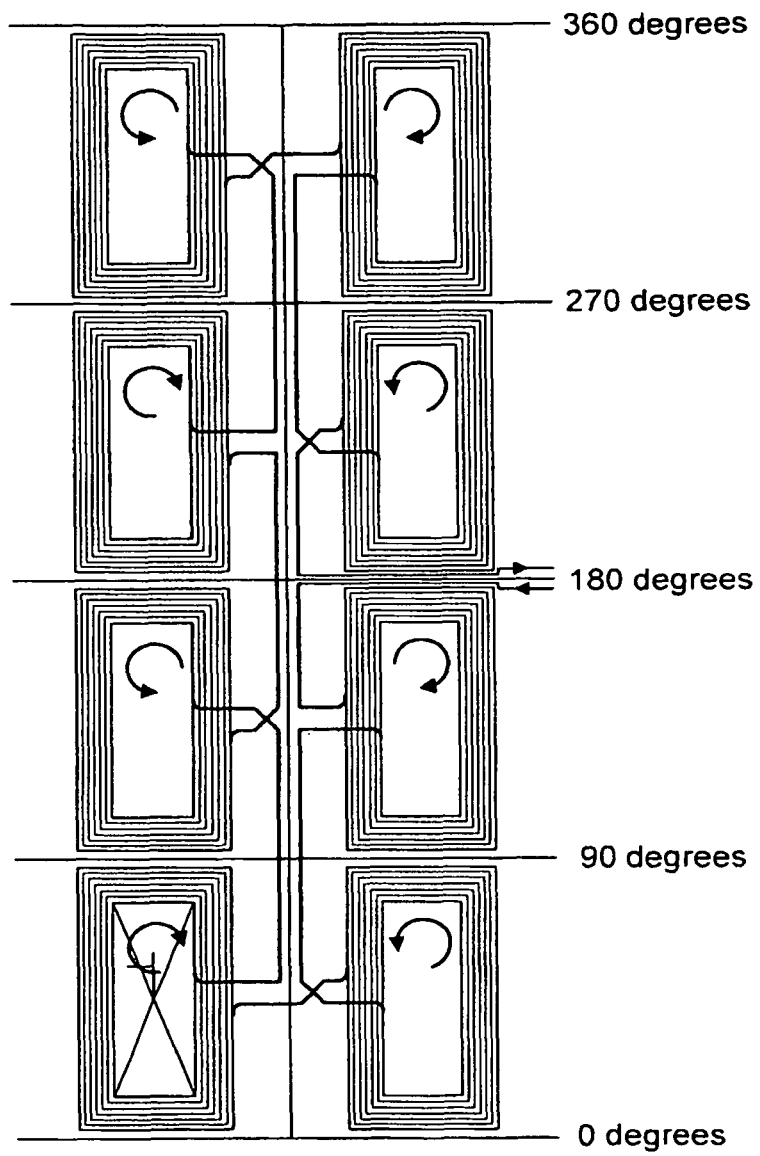
FIG. 2 illustrates how shim saddle coils are arranged in an MRIS apparatus.

A method of forming a shim coil in accordance with one embodiment of the present invention comprises the following steps. A sheet of solid conductor is partially cut to form the conductor pattern shown generally in FIG. 1 of the drawings. This cutting is carried out in such a way that bridges or narrow joints are left periodically between the conductive elements (10) for support. The cutting process can be carried out by a variety of techniques that include punching, water-jet cutting or laser cutting. In the case of punching, the operation can be carried out using a CNC machine.

The next step in the process is to stick the partially cut pattern onto an insulating backing material. After this step, the bridges or joining portions are cut away in a second cutting operation. Then a further backing layer is added in order to insulate the holes that are formed during the cutting operation that removes the bridges. Finally, the pattern is rolled where necessary prior to assembly and connection.

Figure 3:
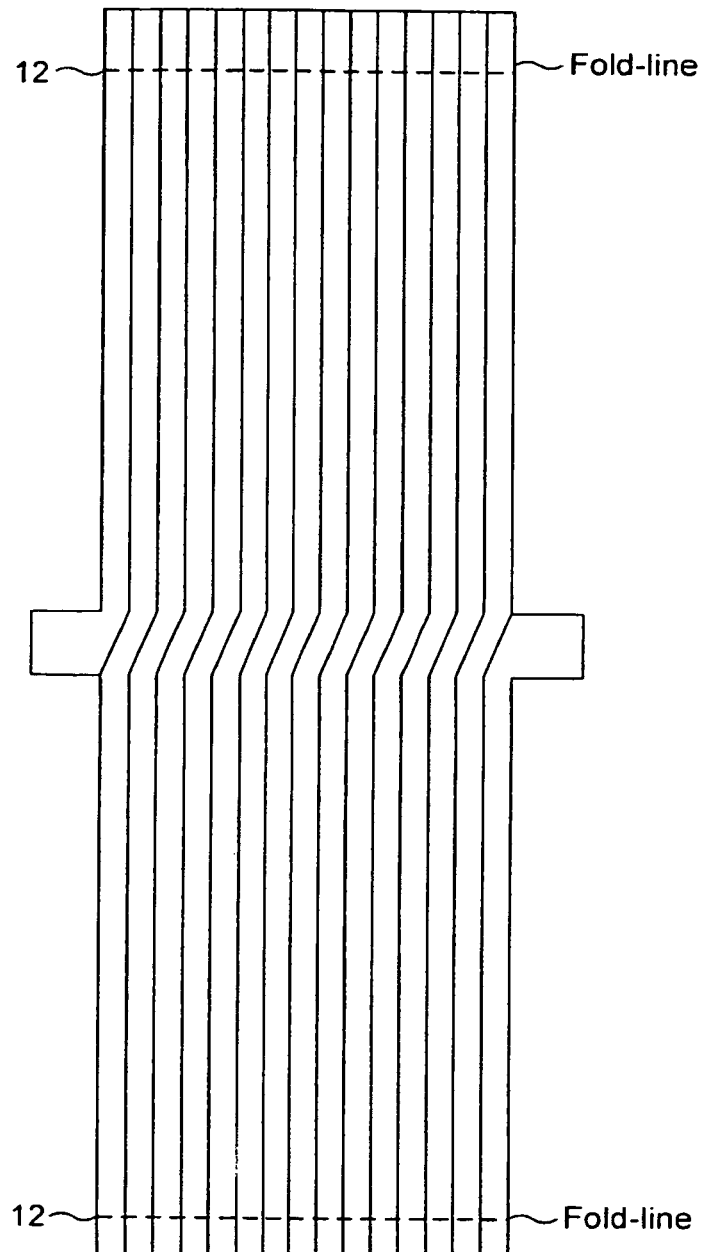
FIG. 3 illustrates how an axial shim coil can be made.

In order to form an axial shim coil, a series of discontinuous arcs can be punched in a sheet of conductive material (FIG. 3). The discontinuous arcs can include the bridges referred to above with reference to FIG. 1. The sheet is then rolled so that opposite ends are adjacent and continuous arcs are formed. The opposite ends can be folded about fold lines (12) so that they are juxtaposed in a radial direction. The coil is then located in an MRIS apparatus and electrical connections move to join the juxtaposed end portions.

Figure 4:
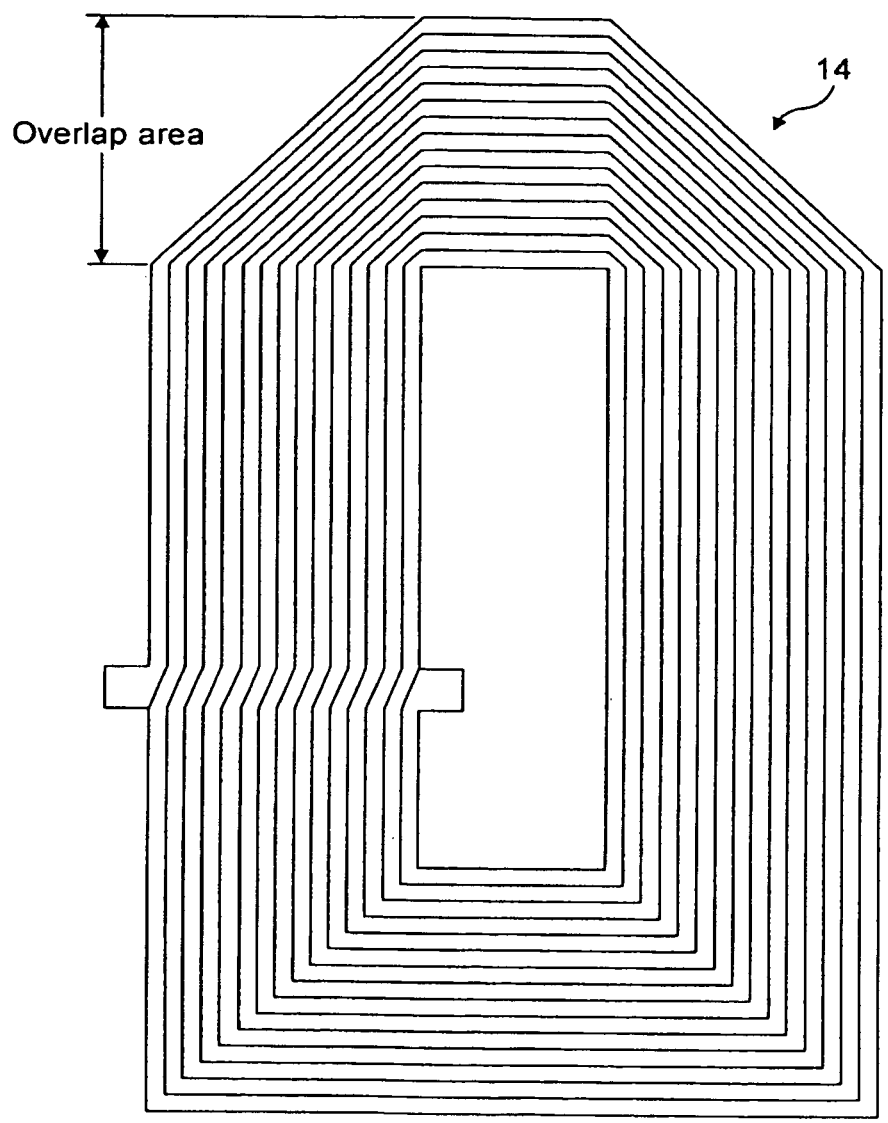
FIG. 4 illustrates the formation of an anti-symmetric shim coil.

Anti-symmetric shim coils can also be formed as shown in FIG. 4. A saddle coil is punched from a sheet of conductive material, the saddle extending over more than a circumference. This gives an overlap area (14) where axial circuits are cancelled.

In comparison to coils that are hand-wound from insulated strips, the method described above has the following advantages:

1. Repeatability;
2. Accuracy;

3. Correspondence with theoretical design—no rounding of the corners of a saddle during winding;
4. Reduced labor and skill;
5. Improved structural adhesion compared to an insulated conductor; and
6. Comparable mean current density when all forms of insulation are taken into account.

In comparison to the prior art technique of photo-etching of coils, the above-described method has the following advantages:
1. Reduced cost;
2. It is readily scalable to large currents typically of 1 to 10 amps; and
3. Increased mean current density when all forms of insulation are taken into account.

What is claimed is:

1. An electrical MRIS shim coil comprising:
   an MRIS shim coil pattern punched from a sheet of electrically conductive material; and
   the punched pattern of conductive material being attached to an insulating substrate in forming a finished MRIS shim coil,
   wherein the punched pattern initially includes bridging portions between lengths of conductive material in the punched pattern. the lengths forming coil conductors in the finished MRIS shim coil;
   said bridging portions being removed after attachment of the punched pattern to the substrate.

2. An electrical MRIS shim coil comprising:
   plural adjacently positioned MRIS shim coil windings created by punch-cutting a continuous sheet of electrically conductive material along spaced apart paths and removing cut-away material along said paths to leave space therealong; and
   remaining portions of the conductive material being subsequently affixed to an insulating substrate,
   wherein said punch-cutting comprises:
   a first punch-cutting step wherein plural spaced-apart bridges of material are left along the cutting paths to physically maintain adjacent as-cut positions of conductive MRIS shim coil windings while said insulating substrate is adhered thereto, followed by a second cutting step wherein said spaced-apart bridges are cut off to completely form an electrical separation between the adjacent MRIS shim coil windings thus formed.

3. An electrical MRIS shim coil as in claim 2, wherein said punch-cutting creates one continuous spiral cut path in said continuous sheet of electrically conductive material.

4. An electrical MRIS shim coil as in claim 2, wherein said punch-cutting creates plural parallel cut paths in said continuous sheet of electrically conductive material to create opposing ends that are bent and electrically connected by forming the remaining portions of conductive material, and the supporting insulating substrate, into a closed shape.

5. An electrical MRIS shim coil as in claim 2, wherein said continuous sheet of electrically conductive material includes one continuous spiral cut path as a result of the punch-cutting.

6. An electrical MRIS shim coil as in claim 2, wherein said continuous sheet of electrically conductive material includes plural parallel cut paths as a result of the punch-cutting, and wherein opposing ends are bent and electrically connected by forming the remaining portions of conductive material, and the supporting insulating substrate, into a closed shape.

7. An electrical MRIS shim coil punch-cut from a sheet of electrically conductive material and including plural adjacently positioned MRIS shim coil windings along spaced apart paths,
   wherein plural spaced-apart bridges of material are removable from cutting paths after the punch-cut sheet is connected to an insulating substrate.

8. An electrical MRIS shim coil as in claim 7, wherein the bridges are formed via the initial punch-cutting.

9. An electrical MRIS shim coil, comprising:
   an insulating substrate;
   an electrical MRIS shim coil pattern connected to the insulating substrate, the electrical MRIS shim coil pattern being punch-cut from a sheet of electrically conductive material so as to initially include removable bridging portions between lengths of conductive material in the pattern, the removable bridging portions being removed following connection to the substrate.

* * * * *